United States Patent [19]

Kuijk et al.

[11] Patent Number: 5,056,894
[45] Date of Patent: Oct. 15, 1991

[54] SWITCHING UNIT FOR A DISPLAY DEVICE AND DISPLAY DEVICE INCLUDING SUCH A SWITCHING UNIT

[75] Inventors: Karel E. Kuijk; Frederikus R. J. Huisman, both of Eindhoven, Netherlands

[73] Assignee: U.S. Philips Corporation, New York, N.Y.

[21] Appl. No.: 479,330

[22] Filed: Feb. 13, 1990

[30] Foreign Application Priority Data

Mar. 3, 1989 [NL] Netherlands ............................ 8900521

[51] Int. Cl.⁵ ............................ G02F 1/13; G09G 3/36
[52] U.S. Cl. .............................................. 350/58; 359/60
[58] Field of Search .................... 350/331 R, 332, 333, 350/334, 336, 339 R; 340/784; 357/4, 15, 45

[56] References Cited

U.S. PATENT DOCUMENTS

| | | | |
|---|---|---|---|
| 4,683,183 | 7/1987 | Ono | 350/333 |
| 4,709,992 | 12/1987 | Ueno | 350/333 |
| 4,715,685 | 12/1987 | Yaniv et al. | 350/333 |
| 4,738,513 | 4/1988 | Nishiura et al. | 350/333 |
| 4,748,445 | 5/1988 | Togashi et al. | 340/784 |
| 4,768,863 | 9/1988 | Fertig et al. | 350/336 |
| 4,820,024 | 4/1989 | Nishiura | 350/333 |
| 4,943,143 | 7/1990 | Yamashita | 350/339 R |
| 4,958,152 | 9/1990 | Kuijk et al. | 350/333 |
| 4,994,796 | 2/1991 | Kuijk | 350/333 |

FOREIGN PATENT DOCUMENTS 0296662 12/1988 European Pat. Off. ............ 350/333

Primary Examiner—Stanley D. Miller
Assistant Examiner—Tai Van Duong
Attorney, Agent, or Firm—John C. Fox

[57] ABSTRACT

An a:Si diode (7) for use in LCDs is located between two metal contacts (10, 15) which extend throughout the diode surface. This reduces the detrimental effect due to the light sensitivity of (amorphous) silicon. A MIM element (8) parallel to the diode (7) is obtained by having the metal contacts project further and by providing a thin layer of insulating material (13, 19) between these contacts.

14 Claims, 1 Drawing Sheet

SWITCHING UNIT FOR A DISPLAY DEVICE AND DISPLAY DEVICE INCLUDING SUCH A SWITCHING UNIT

BACKGROUND OF THE INVENTION

The invention relates to a switching unit which comprises a non-linear asymmetric switching element of a thin layer of semiconductor material and having a lower contact and an upper contact.

The invention also relates to a display device in which such a switching unit is used.

As is known, such a display device is suitable, for example, for displaying datagraphic information and video information by means of an array of pixels including a passive electro-optical display media such as liquid crystals, electrophoretic suspensions or electrochromic materials the pixels electrically connected to row electrodes and to column electrodes via switches.

The use of such switching elements in such display devices provides the possibility of increasing the number of rows of pixels to be driven. In fact, the switching elements provides a sufficiently high threshold so that a pixel cannot be driven if the relevant row is not selected. In addition the switching element ensures that the information presented while a row electrode is being driven subsists across a pixel during the period when the other row electrodes are driven. The switching element also prevents a pixel from undergoing an effective voltage during the period when it is not driven.

European Patent Application No. 0296662, to Kuijk, describes a display device in which the pixels are given voltages by means of switching units which comprise an asymmetric non-linear switching element, for example, a diode. The voltage across the pixels is accurately adjusted by means of these units after the associated capacitances are first discharged or charged, if necessary, beyond the range of transition in the transmission/voltage characteristic of the electro-optical medium. To this end, the switching unit also comprises a non-linear switching element, for example, a MIM (metal-isolator-metal) element which is arranged (anti) parallel to the diode.

Such diodes are usually made of amorphous silicon. One of the drawbacks of amorphous silicon is its sensitivity to light, resulting in the off-current $I_{off}$ of such diodes being unacceptably high when they are irradiated with light. The light sensitivity problem may also occur (though to a lesser extent) when using other semiconductor materials, for example, polycrystalline silicon.

Moreover, the switching unit comprises two separate elements which reduces the effective size of the associated pixel and sometimes requires different fabrication technologies.

OBJECT AND SUMMARY OF THE INVENTION

It is an object of the invention to mitigate these drawbacks as much as possible.

The invention is based on the recognition that a satisfactory shielding of the non-linear asymmetric switching element from light can be combined with the manufacture of a non-linear resistance element or metal-insulator-metal element (MIM).

A device according to the invention is characterized in that, at least the material of one of the upper and lower contacts of the switching element is opaque to light and extends across one surface of the semiconductor material to shield the semiconductor material from light incident on that surface, while the materials of the lower contact and the upper contact together with an intermediate layer of insulating material constitute a non-linear resistance element or MIM element.

In this way a very compact combination of a non-linear asymmetric switching element and a non-linear resistance element (for example, a diode and a MIM) is obtained. A display device which is based on this combination can be driven by the method described in NL 8800704.

Although this is not strictly necessary, the two contacts are preferably made of metal and the metal of the two contacts extends throughout the surface of the semiconductor material. This semiconductor material is then completely shielded from incident light so that notably for amorphous silicon the properties of switching elements made of this material no longer varies under the influence of incident light.

To obtain a satisfactory operation of the MIM element, the layer of isolating material, which may comprise, for example, silicon oxide, silicon nitride, oxynitride or polyimide, has a thickness of 30–200 nm.

A display device according to the invention, comprising an electro-optical display medium between two supporting plates, a system of pixels arranged in rows and columns, with each pixel being constituted by picture electrodes arranged on the facing surfaces of the supporting plate and a system of row and column electrodes comprises for each pixel a switching unit which, as described, is arranged between a picture electrode and a row or column electrode.

BRIEF DESCRIPTION OF THE DRAWING

The invention will now be described in greater detail with reference to some embodiments and the drawing in which FIG. 2 is a diagrammatic plan view of a switching unit according to the invention, while

The Figures are not drawn to scale; corresponding elements usually have the same reference numerals.

DESCRIPTION OF PREFERRED EMBODIMENTS

Figure 1:
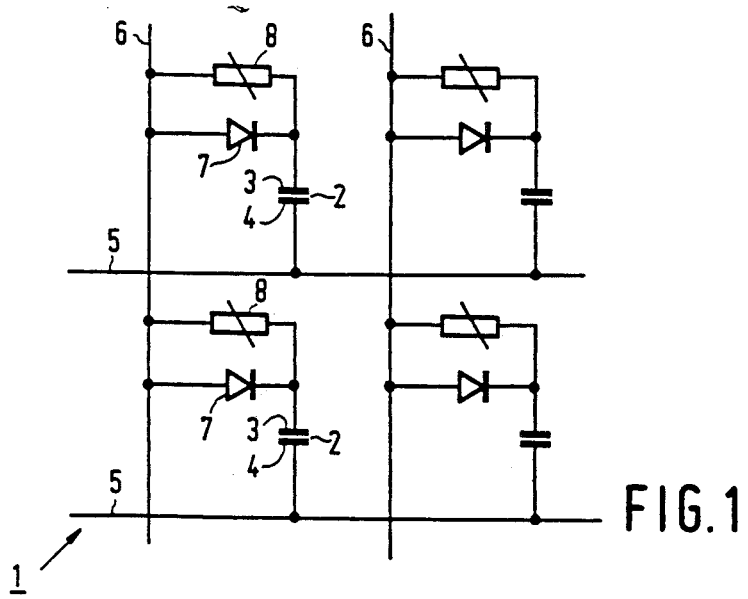
FIG. 1 shows diagrammatically a display device according to the invention.

FIG. 1 shows diagrammatically a part of a display device 1 according to the invention. Pixels 2, which are constituted in a liquid crystal display device by, for example, facing picture electrodes 3, 4 between which a layer of liquid crystal material is present, are connected to row electrodes 5 via the picture electrode 4, which row electrodes together with the column electrodes 6 are arranged in the form of a matrix. The picture electrodes 3 of the pixels 2 are connected to the column electrodes 6 via a switching unit which comprises a diode 7 in this embodiment and a MIM element 8 (metal-isolator-metal) arranged parallel thereto.

Figure 2:
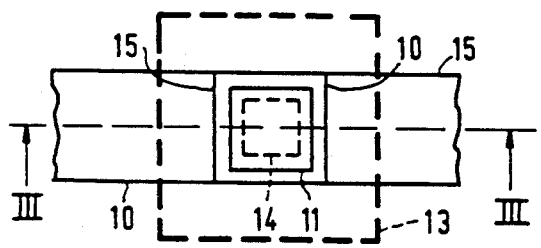
Figure 3:
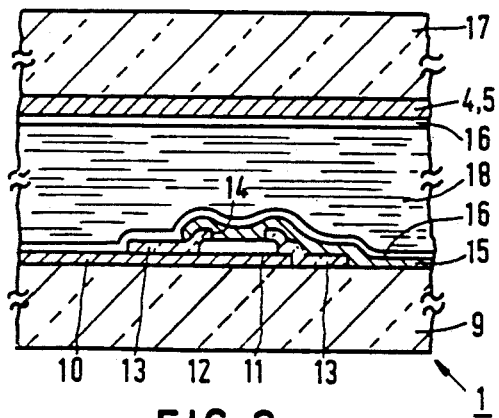
FIG. 3 is a diagrammatic cross-section taken on the line III—III in FIG. 2

FIG. 2 is a plan view and FIG. 3 is a cross-section of a possible realization of the switching unit, arranged on a supporting plate 9 which is made of, for example, glass or quartz. The supporting plate 9 is also provided with metal tracks 10 which are provided, for example, simultaneously with column electrodes 6 (not shown in FIGS. 2, 3) or form part thereof. The metal tracks 10 may be made of aluminium, chromium, tungsten or molybdenum, etc. and contact semiconductor regions 11 in which the diodes 7 are realized. The semiconductor regions 11 comprise, for example, a layer of p-type doped amorphous silicon on the lower side, a layer of intrinsic amorphous silicon and a layer of n-type amorphous silicon on the upper side. These layers are provided, for example, by means of plasma CVD or sputtering. This results in a pin diode 7. In order to contact the diode on the upper side with the conducting layer 15, which is connected to the picture electrode 3 (not shown), the isolating layer 13 protecting the semiconductor material has a contact hole 14. In this example the conducting layer 15 is a second metal track of, for example, aluminium, chromium, tungsten, molybdenum, etc.

According to the invention at least one of the metal tracks 10, 15 extends throughout the surface of the semiconductor material, as seen in the plan view. In the relevant example the two metal tracks 10, 15 extend throughout this surface.

Since the metal tracks are opaque to light, the semiconductor region 11 is entirely shielded from light which passes the supporting plate 9. When using a transparent supporting plate, provided with such a switching unit, the properties of the diode 7 can therefore no longer change due to the light sensitivity of the amorphous silicon.

According to the invention, the thickness of the isolating layer 13 is simultaneously chosen to be such, in this example 60 nm, that the metal layers 10, 15 together with this layer 13 constitute a MIM element (metal-isolator-metal), parallel to the diode 7. For connection to a pixel, the metal contact 15 is connected to a transparent picture electrode 3 (not shown) of, for example, indium tin oxide, tin oxide or zinc oxide, while the assembly of switching units, column electrodes and picture electrodes is coated with an orienting layer 16 which may also serve as a protective layer.

In this embodiment the display device 1 further comprises a second supporting plate 17 provided with transparent picture electrodes 4 which may coincide, if necessary, with strip-shaped row electrodes 5 and are coated with an orienting (and protective) layer 16. The orienting layers 16 give the molecules of a liquid crystal material 18 which is present between the two supporting plates a given peripheral orientation which may also be determined by the liquid crystal effect to be used (twisted nematic, birefringent effects, SBE, ferroelectric, etc.). Furthermore, the device may conventionally have one or more polarizers, not shown.

The switching units are obtained, for example, by firstly coating the supporting plate 9 with a metal layer (aluminium, chromium, tungsten, molybdenum, etc.) which is subsequently patterned photolithographically, for example, in the shape of parallel column electrodes 6 and the metal tracks 10 are connected thereto in an electrically conducting manner. The assembly is subsequently coated with a layer of p-type amorphous silicon, a layer of intrinsic amorphous silicon and a layer of n-type amorphous silicon from which semiconductor regions 11 are formed in the conventional manner by means of a photolithographic process. After having coated the assembly with a 60 nm thick layer of isolating material, in this example silicon oxide (for example by means CVD techniques or sputtering), the regions 13 from this layer are defined photolithographically while simultaneously opening the contact holes 14.

Subsequently, the metal tracks 15 are provided by means of a photolithographic process. The picture electrodes 3 may have been provided on the supporting plate 9 at an earlier stage, but they may also be the last to be provided. Alternatively, the layer 15 and the picture electrodes 3 can be simultaneously realised in light-transparent electrically conducting material such as indium tin oxide, for example, in display devices for projection television which are illuminated from the back of the supporting plate 9. If illumination takes place from the back of the supporting plate 17, the metal layer 15 may form part of the column electrodes or it may be connected thereto in an electrically conducting manner, while the conducting tracks 10 form part of the pattern of light-transparent conducting material (for example, indium tin oxide) of which the picture electrodes 3 are made. In that case the conductivity type in the semiconductor material may be chosen to be of the reverse type, but this is not strictly necessary.

Figure 4:
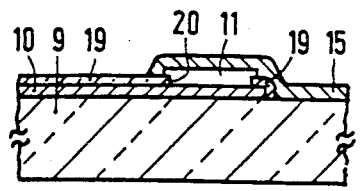
FIG. 4 is a diagrammatic cross-section of a modification of the switching unit of FIG. 3.

The device of FIG. 4 is obtained by slightly oxidizing or coating the metal tracks 10 with a layer of isolating material (if necessary, simultaneously with the column electrodes) after these metal tracks have been provided. Contact holes 20 are etched in the oxide layer 19 thus obtained, within which holes semiconductor regions 11 comprising layers of the desired conductivity type are photolithographically defined and fill up the contact holes 20 completely. Subsequently the assembly is coated with a metal layer from which the metal tracks 15 are formed; together with the layer 19, the metal tracks 15 and 10 then constitute a MIM element or a non-linear resistance element parallel to an asymmetric non-linear switching element realised in the semiconductor region 11.

The invention is of course not limited to the embodiments shown, but various modifications are possible within the scope of the invention.

For example, throughout this text row electrode can be replaced by column electrode and vice versa.

A continuous row or column electrode may function as a lower or upper contact, respectively, for the switching unit, while the picture electrodes may also extend above or below the switching units.

If necessary, one of the metal tracks 10, 15 may constitute a Schottky barrier with the semiconductor material, for example, by providing aluminium, molybdenum, platinum, palladium or tungsten on intrinsic amorphous silicon. Other non-linear asymmetric switching elements, such as pin diodes, etc. may also be made from the semiconductor material.

The semiconductor material need not be amorphous silicon, but may alternatively be polycrystalline silicon, crystallized amorphous silicon on polycrystalline silicon or, for example, an $A_3$-$B_5$ compound such as CdSe, GaAs, etc.

The invention is not only applicable to liquid crystal display devices but also to other display devices such as ECDs, etc.

We claim:

1. A display device provided with a supporting plate and including at least one switching unit which comprises a non-linear asymmetric switching element in a thin layer of semiconductor material and has a lower contact and an upper contact, characterized in that, at least the material of one of the contacts is opaque to light and extends throughout the surface of the semiconductor material, in that the other contact is made of a light-transparent material, and further characterized in that an intermediate layer of insulating material together with the materials of the lower contact and the upper contact constitute a non-linear resistance element or MIM element.

2. A device as claimed in claim 1, characterized in that the semiconductor material is amorphous silicon.

3. A device as claimed in claim 1, characterized in that the light-transparent material is indium tin oxide, zinc oxide or tin oxide.

4. A device as claimed in claim 1, characterized in that the thickness of the layer of insulating material is at most 200 nm.

5. A device as claimed in claim 1, characterized in that the insulating material comprises silicon nitride, silicon oxide, oxynitride or polyimide.

6. A device as claimed in claim 1, characterized in that the semiconductor material is provided in an opening in a layer of insulating material covering the material of the lower contact.

7. A device as claimed in claim 6, characterized in that the layer of insulating material comprises a metal oxide.

8. A device as claimed in claim 1, characterized in that one of the materials of the contacts constitutes a Schottky barrier with the semiconductor material.

9. A display device as claimed in claim 1, comprising an electro-optical display medium between two supporting plates, a system of pixels arranged in rows and columns, with each pixel being constituted by picture electrodes arranged on the facing surfaces of the supporting plate and a system of row and column electrodes, characterized in that for each pixel a switching unit is arranged between a picture electrode and a row or column electrode.

10. A display device as claimed in claim 9, characterized in that the display medium is liquid crystal material.

11. A device as claimed in claim 2, characterized in that the thickness of the layer of insulating material is at most 200 nm.

12. A device as claimed in claim 3, characterized in that the thickness of the layer of insulating material is at most 200 nm.

13. A device as claimed in claim 2, characterized in that the insulating material comprises silicon nitride, silicon oxide, oxynitride or polyimide.

14. A device as claimed in claim 2, characterized in that the semiconductor material is provided in an opening in a layer of insulating material covering the material of the lower contact.

* * * * *